(12) United States Patent
Olzak et al.

(10) Patent No.: US 6,862,190 B2
(45) Date of Patent: Mar. 1, 2005

(54) ADAPTER FOR PLASTIC-LEADED CHIP CARRIER (PLCC) AND OTHER SURFACE MOUNT TECHNOLOGY (SMT) CHIP CARRIERS

(75) Inventors: Richard A. Olzak, Kirkland, WA (US); Tehmosp Khan, Shoreline, WA (US)

(73) Assignee: Honeywell International, Inc., Morristown, NJ (US)

( * ) Notice: Subject to any disclaimer, the term of this patent is extended or adjusted under 35 U.S.C. 154(b) by 64 days.

(21) Appl. No.: 10/052,715

(22) Filed: Jan. 17, 2002

(65) Prior Publication Data

US 2002/0093803 A1 Jul. 18, 2002

Related U.S. Application Data

(60) Provisional application No. 60/262,474, filed on Jan. 17, 2001.

(51) Int. Cl.[7] ................................................ H05K 7/06
(52) U.S. Cl. ................... 361/768; 361/803; 174/262; 174/263; 257/698
(58) Field of Search .................... 361/767, 768, 361/777, 779, 803; 174/262, 263; 257/698, 778

(56) References Cited

U.S. PATENT DOCUMENTS

| | | | | |
|---|---|---|---|---|
| 3,483,308 A | * | 12/1969 | Wakely | 174/52.1 |
| 4,437,141 A | * | 3/1984 | Prokop | 361/771 |
| 5,293,067 A | * | 3/1994 | Thompson et al. | 257/668 |
| 5,471,368 A | * | 11/1995 | Downie et al. | 361/760 |
| 5,796,591 A | * | 8/1998 | Dalal et al. | 361/779 |
| 5,941,447 A | * | 8/1999 | Chu et al. | 228/180.21 |
| 6,031,728 A | * | 2/2000 | Bedos et al. | 361/767 |
| 6,147,876 A | * | 11/2000 | Yamaguchi et al. | 361/766 |
| 6,395,996 B1 | * | 5/2002 | Tsai et al. | 174/260 |
| 6,452,112 B1 | * | 9/2002 | Terashima et al. | 174/260 |
| 6,534,726 B1 | * | 3/2003 | Okada et al. | 174/263 |

FOREIGN PATENT DOCUMENTS

| | | |
|---|---|---|
| DE | 37 05 828 A1 | 10/1987 |
| JP | 6 224537 | 8/1994 |
| JP | 9 298351 | 11/1997 |
| JP | 11 214820 | 8/1999 |
| WO | WO 94/01987 | 1/1994 |

OTHER PUBLICATIONS

ABSTRACT, Patent Abstracts of Japan, Publication No. 06224537, Publication Date: Aug. 12, 1994; 05028607 –Jan. 25, 1993, Ichiyama Yuzo, Lead Pitch Changing Board for Surface Mounting.

ABSTRACT, Patent Abstracts of Japan, Publication No. 09298351, Publication Date: Nov. 18, 1997; 08110798—May 1, 1996, Tada Toshiyuki, Circuit Pattern Converting Subprinted Board.

ABSTRACT, Patent Abstracts of Japan, Publication No. 11214820, Publication Date: Aug. 6, 1999; 10029113—Jan. 27, 1998, Saegusa Katsumi, Mounting Structure For LCC.

* cited by examiner

*Primary Examiner*—John B. Vigushin
(74) *Attorney, Agent, or Firm*—Charles J. Rupnick

(57) ABSTRACT

An adapter for a surface mount device, the adapter including an insulating body having offset first and second surfaces; a pattern of surface mount solder pads formed on the first surface; a pattern of signal carriers communicating between the first and second surfaces, each of the signal carriers being at least partially exposed in an area between the first and second surfaces and adjacent to the second surface; and a plurality of signal lines electrically coupling one or more of the surface mount solder pads with predetermined ones of the signal carriers.

32 Claims, 2 Drawing Sheets

ADAPTER FOR PLASTIC-LEADED CHIP CARRIER (PLCC) AND OTHER SURFACE MOUNT TECHNOLOGY (SMT) CHIP CARRIERS

This application claims the benefit of U.S. Provisional Application Ser. No. 60/262,474, filed in the names of Richard Olzak and Tehmosp Khan on Jan. 17, 2001, the complete disclosure of which is incorporated herein by reference.

FIELD OF THE INVENTION

The present invention relates to adapters for plastic-leaded chip carriers, and in particular to adapters for smaller plastic-leaded chip carriers replacing larger plastic-leaded chip carriers.

BACKGROUND OF THE INVENTION

An integrated circuit combines numerous active and passive electrical circuitry elements on a single device called a die or chip. These integrated circuits are interconnected by attaching them to printed circuit boards. Integrated circuits are small and fragile; therefore, for use in mass production they are typically sealed in plastic or ceramic packages, called carriers, in which they are protected from damage. The integrated circuit is electrically interconnected to the external leads or pads that extend from the package. The external leads are used to connect the package to a printed wiring board or a socket. The external leads may protrude from the package by extending through the bottom of the package (e.g., pin or pad grid arrays), may be arrayed along two edges of the package (e.g., dual in-line pins), or may fan out from the edges of the package (e.g., gull wing and J-leads). The carriers are small in size and are known to have high electrical and mechanical reliability.

The wiring on application or parent printed circuit boards include thin metallic signal lines embedded in an insulating material. These signal lines interconnect leads from different circuit packages mounted on the same board. The boards may have several layers of interconnected signal lines to provide all of the required connections. The signal lines route electrical signals among the integrated circuits. The lay out of the signal lines thus determines the placement of the integrated circuit packages on the board. The leads of the integrated circuit packages may connect to the wiring in a variety of ways. One technique includes holes drilled in the board through the wiring at appropriate locations. The leads are inserted through the holes, whereby mechanical and electrical attachments are made among the leads, the wiring, and the holes.

Another technique is called surface mount technology (SMT). This method includes arranging contact pads on the surface of the printed circuit board. The pads are used to route input/output electrical signals through the leads and the appropriate signal lines in the parent printed circuit board. The package leads may be placed on top of the pads and mechanically and electrically attached by soldering. SMT is widely used for high speed digital communications. Typical SMT packages include plastic leaded chip carriers (PLCC), dual in-line packages (DIP), single in-line packages (SIP), small outline packages (SO), and small outline T-leaded packages (SOT). Each device has a different specific footprint associated with its external leads.

FIG. 1 is a generic illustration of a common SMT integrated circuit carrier 10 of the type that is commonly referred to as a Plastic Leaded Chip Carrier, usually abbreviated as PLCC or PCC. The carrier 10 is a rectangular or square package having a housing 12 with a top surface 14 and four sides 16–19 with I/O connections on all four sides. On the leaded version illustrated in FIG. 1, the I/O connections are a row of uniformly spaced electrically conductive leads 20 extending from each side of the carrier housing 12. The PLCC 10 can have 18 to 100 J-shaped leads. PLCC packages can be either socketed or surface-mounted onto solder pads of a printed wiring board 22. Soldering is preferred for applications requiring long term electrical and mechanical reliability.

Over time the design of integrated circuits, or ICs, has improved functionality, which has resulted in smaller devices with fewer I/O connections required to perform the same tasks more efficiently. The carriers, such as the PLCC 10 illustrated in FIG. 1, have evolved to match the more compact and efficient ICs. According to one example, a known IC packaged in a PLCC having 68 I/O pins has become obsolete through having its functionality provided more efficiently in a newer IC that is packaged in a more compact PLCC device having a smaller foot print and fewer I/O connections, i.e., only 44 I/O pins.

New printed wiring board designs reduce the space available to match the more compactly packaged PLCC device and provide 24 fewer surface-mount solder pads in a configuration matched to the device's 44 I/O pins. However, many pre-existing printed wiring board are designed for use with the now obsolete 68-pin device. While a 44-pin PLCC replacement is functionally and conveniently smaller, these earlier designs will not accept the newer 44-lead device. Some high-production boards have been redesigned and re-laid out to accommodate the new smaller devices having fewer I/O connections. Redesign requires considerable time that impacts production schedules and involves financial investments that may not be easily justified on legacy products with a limited future.

Rather than bear the disruption and expense of a redesign, some of these legacy products use an adapter that accommodates the difference in footprints in different PLCC and other SMT components. For example, one of these adapters accepts the smaller 44-pin device and provides electrical routing that adapts the functionality of the 44-pin device to the 68-pin configuration. The smaller 44-pin device is mounted on the adapter, and the adapter is mounted in turn on the parent printed wiring board in the position previously occupied by the 68-pin device. The adapter couples functionality of the replacement 44-pin PLCC device to appropriate connections on the original parent printed wiring board, which are configured to match the foot print and functionality of the original 68-pin PLCC device. For purposes of the specific application, the newer, more efficient 44-pin device performs all the functions of the replaced 68-pin device.

Unfortunately, known adapters for PLCC and other SMT components are limited. Many such adapters provide only pins for insertion directly into sockets on the printed wiring board. However, as discussed above, soldering is preferred to socket insertion for applications requiring long term electrical and mechanical reliability. While other adapters provide for solder joints between the adapter and the printed wiring board, known adapters do not provide for easy visual inspection of the quality of solderjoints. Therefore, the conscientious manufacturer must resort to more laborious and time consuming electrical testing techniques to ensure reliability.

SUMMARY OF THE INVENTION

The present invention provides replacement of obsolete surface mount device by available surface mount devices in a manner that permits visual inspection of solder joints between the adapter and the using printed circuit board, in contrast to the prior art devices and methods.

The apparatus and method of the present invention is an adapter that accommodates differences in footprints between different surface mount devices, such as Plastic Leaded Chip Carrier (PLCC) components. The adapter of the invention is attached to the using printed circuit board at the position of an obsolete component in a conventional manner utilizing conventional soldering processes. The adapter then accepts a smaller replacement part and routes the signals from the replacement to the using printed circuit board without loss or interruption.

According to one aspect of the invention, the adapter of the invention is embodied as an adapter for a surface mount device, the adapter including an insulating body having offset first and second surfaces; a pattern of surface mount solder pads formed on the first surface; a pattern of signal carriers communicating between the first and second surfaces, each of the signal carriers being at least partially exposed in an area between the first and second surfaces and adjacent to the second surface; and a plurality of signal lines electrically coupling one or more of the surface mount solder pads with predetermined ones of the signal carriers.

According to one aspect of the invention, the adapter also includes a pattern of electrical contacts formed on the second surface, the electrical contacts being electrically coupled to different ones of the signal carriers.

According to another aspect of the invention, the insulated body of the adapter includes a signal layer laminated between the first and second surfaces with one or more of the plurality of signal lines being formed on the signal layer.

According to another aspect of the invention, each of the signal carriers includes an electrically conductive material formed on an interior surface of a passage that communicates between the first and second surfaces.

According to another aspect of the invention, the signal lines couple a function of a replacement surface mount device to a signal carrier that corresponds to a position in the pattern of signal carriers that is associated with a similar function provided by a replaced surface mount device. The adapter thus permits a replacement device having substantially identical input/output signals to the original device but provided on different pins to be interfaced with the application, without loss or interruption of the input/output signals and without any change to the using printed circuit board.

According to other aspects of the invention, the invention provides methods for adapting a replacement surface mount device to substitute for an original device, without changing the using application.

According to yet other aspects of the invention, the invention provides a parent application printed circuit board having a replacement surface mount device substituted for an original surface mounted device, the assembly including an adapter formed of a printed circuit board having a top layer and a bottom layer; a footprint formed on the top layer of the printed circuit board; a first surface mount device being mounted to the footprint on the top layer of the printed circuit board; a plurality of signal carriers positioned along different peripheral edges of the printed circuit board and extended between the top and bottom layers of the printed circuit board with the signal carriers being at least partially exposed in an area adjacent to the bottom layer, each of the signal carriers being electrically and mechanically joined by soldering to a corresponding contact area of the printed circuit board; and a plurality of signal lines for communicating signals between corresponding contact areas of the foot print and at least some of the signal carriers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an adapter apparatus and method for accommodating the difference in footprints between different surface mount technology components, including different PLCC components. The surface mount device adapter attaches to the parent printed wiring board in a conventional manner utilizing the normal soldering process. The adapter accepts a PLCC or other surface mount device smaller than the original device and routes the signals from the smaller size device to the input and output (I/O) connections provided for the original larger size device without loss or interruption.

The adapter of the present invention is useful for a PLCC or other surface mount device. The adapter includes an insulating body having offset first and second surfaces; a pattern of surface mount solder pads formed on the first surface; a pattern of signal carriers communicating between the first and second surfaces, each of the signal carriers being at least partially exposed in an area between the first and second surfaces and adjacent to the second surface; and a plurality of signal lines electrically coupling one or more of the surface mount solder pads with predetermined ones of the signal carriers.

Figure 2:
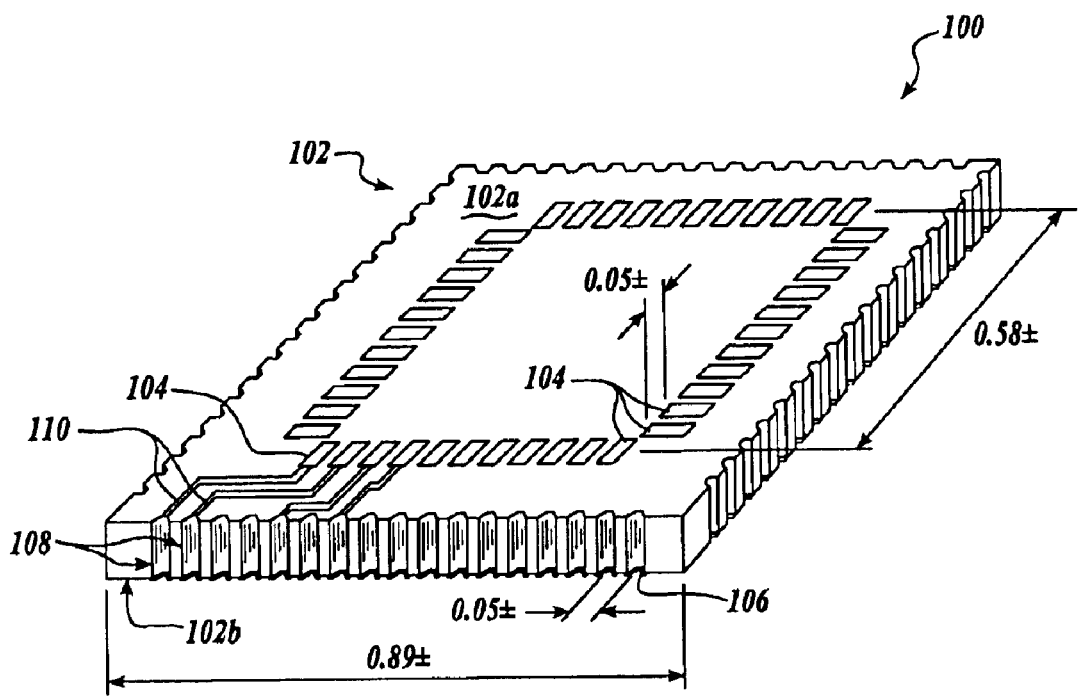
FIG. 2 illustrates the surface mount device adapter apparatus of the invention embodied as a PLCC adapter.

FIG. 2 illustrates the surface mount device adapter apparatus 100 of the invention embodied as a 44-pin to 68-pin PLCC adapter. Although the adapter 100 is illustrated here as a 44-pin to 68-pin PLCC adapter, the illustration is only an example, and the invention is equally applicable to adapt replacement PLCC devices having more or less than 44 I/O pins to applications wherein the original PLCC device had more or less than 68 I/O pins. The adapter of the invention is equally applicable to adapt replacement surface mount devices, other than PLCC devices, for use in applications wherein the replacement device has more or less I/O pins than the original device. In FIG. 2, the surface mount device adapter includes a substantially planar insulating body 102 having a first or primary surface 102a opposite a substantially parallel secondary surface 102b. The body 102 is, for example, formed of either a small laminate ceramic substrate or a printed wiring board (PWB), also known as a printed circuit board (PCB). A first quantity of surface mount technology (SMT) solder pads 104 are formed on the primary surface 102a of the PWB 102, and a quantity of solder contacts 106 are formed on the secondary surface 102b opposite from the first solder pads 104. The solder pads 104 on the primary surface 102a are configured in a pattern of a standard size that readily accepts a replacement PLCC or other surface mount device having a predetermined number of J-shaped I/O leads. For example, the solder pads 104 are configured in a square with eleven solder pads 104 on a side. The rows of pads 104 on each side of the square are centered at about 0.58 inches apart. The individual pads 104 are about 0.05 inches long by 0.02 inches wide and are spaced on 0.05 inch centers. Thus, the solder pads 104 are positioned to mate with the J-shaped I/O leads of a standard 44-pin PLCC device.

Figure 1:
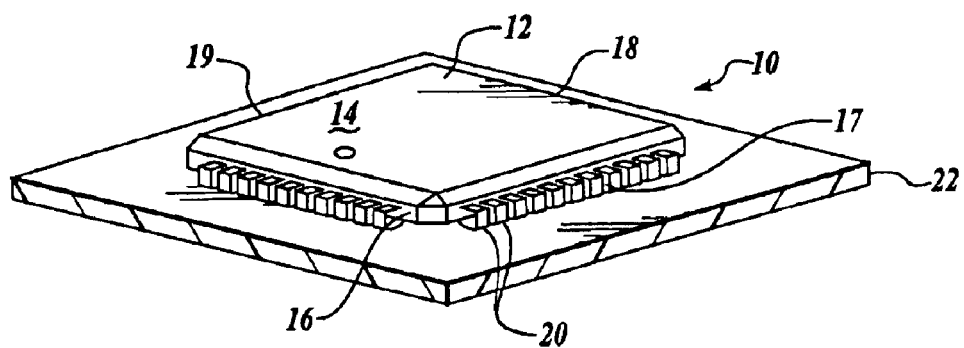
FIG. 1 is an illustration of a common surface mount technology integrated circuit package of the type that is commonly referred to as a Plastic Leaded Chip Carrier.

The quantity of solder contacts 106 on the secondary surface are configured in a pattern of a size that simulates the J-shaped I/O leads of the original PLCC or other surface mount device, and thus the solder contacts 106 readily mate with SMT solder pads at the site of the original 68-pin PLCC device on a parent application PWB, which is the type illustrated in FIG. 1 as the printed wiring board 22. For example, the solder contacts 106 are configured in a second square with seventeen contacts 106 on a side. The rows of contacts 106 on each side of the square are centered at about 0.89 inches apart. The individual contacts 106 are about 0.05 inches long by 0.02 inches wide and are spaced on 0.05 inch centers. Thus, the solder contacts 106 are positioned similarly to the J-shaped I/O leads of a standard 68-pin PLCC device. The solder pads 106 on the secondary side are electrically coupled with the primary side by signal carriers 108 formed of an electrically conductive material, such as copper, nickel, silver, or gold, deposited or plated through holes or grooves that communicate between the two opposing surfaces.

A pattern of different electrical signal lines or traces 110 interconnect some or all of the first solder pads 104 on the primary side 102a with different ones of the signal carriers 108, which are in turn electrically coupled to individual ones of the second solder pads 106 on the secondary side 102b of the PWB 102. The signal lines 110 are configured to interconnect the I/O pins of the replacement PLCC device at the I/O solder pads 104 to the appropriate I/O solder pads 106 of the adapter 100. The appropriate functionality of the smaller replacement PLCC or other surface mount device is thus routed to the I/O pin position associated with that same functionality of the obsolete device without loss or interruption in the signals.

According to the invention, the body 102 of the adapter 100 is manufactured according to conventional manufacturing practices. After the signal carriers 108 are formed, they are opened lengthwise to expose the interior of the plated through hole (in a PWB) or the interior surface of the via (in a substrate). For example, the body 102 of the adapter 100 is milled along the longitudinal axes of the plated through holes or vias 108 on each of the four sides of the square pattern of signal carriers 108 so that the adapter body 102 is cut into a square shape measuring about 0.89 inches on a side. With the interiors of the signal carriers 108 exposed, a solder joint formed at the solder contact 106 at the end of the signal carrier 108 is readily available for visual inspection.

Figure 3:
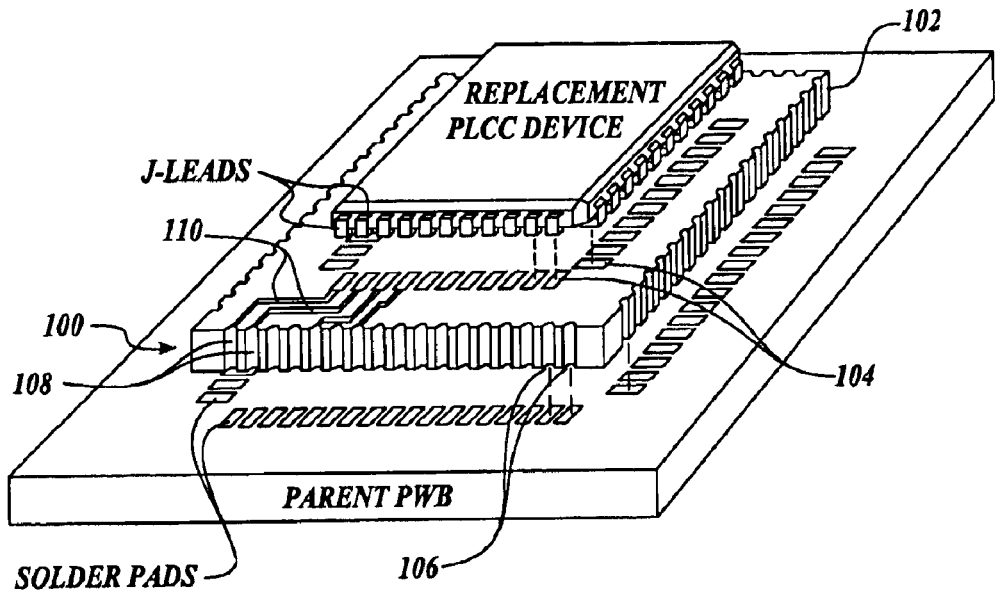
FIG. 3 illustrates assembly of a replacement PLCC device with the surface mount device adapter of the invention, and the assembly of the adapter with a using printed circuit board.

As illustrated in FIG. 3, during assembly, the J-shaped I/O leads of the replacement PLCC or another surface mount device are engaged with the mating solder pads 104 on the primary surface 102a of the PWB 102. The connections are soldered, for example, using either manual or conventional wave soldering techniques. The I/O solder pads 106 on the secondary surface 102b are engaged with SMT solder pads on the parent PWB at the site of the original surface mount device, e.g., the 68-pin PLCC device. When the I/O solder contacts 106 are engaged with solder pads on the parent PWB, the adapter 100 connects the I/O leads of the replacement device with circuitry on the parent application PWB that corresponds to the same functionality. Thus, the adapter 100 routes the I/O signals from one size replacement PLCC to the connections for a different size original PLCC without loss or interruption, thereby accommodating the difference in footprints in different PLCC or other surface mount components.

Furthermore, the signal carriers 108 and solder contacts 106 are exposed along the edges of the PWB 102 so that the solder joints formed with the solder pads on the parent PWB are likewise exposed for visual inspection. Because the interiors of the plated through holes or vias forming the signal carriers 108 are open and exposed, an inspector can visually determine whether solder has properly wicked along the exposed interior length of plated through hole or vias 108 at each and every solder joint. The need for tedious and time consuming electrical testing techniques to ensure reliability is thus eliminated.

According to one alternative embodiment of the invention, the adapter 100 is configured without the solder contacts 106 on the secondary side. Rather, the end of each signal carrier 108 that communicates with the secondary surface is engaged with the solder pads on the parent PWB. During formation of a solder joint, the solder wicks at least part way along the exposed interior length of each signal carrier 108. The solder connections to the parent PWB are thus available for visual inspection, and the need for other inspection and testing techniques is eliminated.

Although illustrated as being formed on the primary surface of the substrate 102, the signal lines or traces 110 may be formed on a separate layer sandwiched between the primary and secondary sides of the PWB or small laminate substrate 102.

Figure 4:
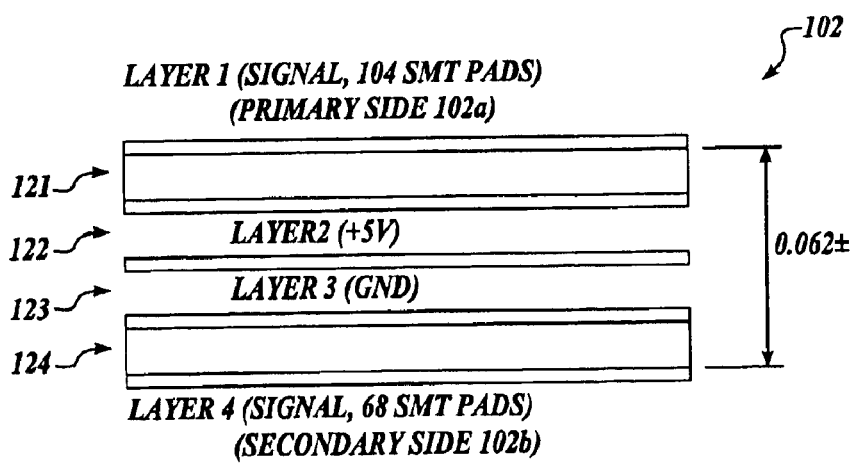
FIG. 4 illustrates the body of the surface mount device adapter of invention embodied as a multilayer printed wiring board or small laminate substrate.

FIG. 4 illustrates the PWB 102 of the surface mount device adapter 100 of the invention embodied as a multilayer printed wiring board/printed circuit board or small laminate substrate 102. For example, the PWB or substrate 102 may include 4 layers 121-124. The top layer 121 is the primary signal side 102a having the first pattern of SMT solder pads 104 configured to match the I/O pins of the replacement 44-pin PLCC or other surface mount device. The second layer 122 is the signal layer on which the signal lines, or traces 110, are routed between the I/O positions of the original 68-pin PLCC or other surface mount device and the I/O positions of the 44-pin or other surface mount replacement device where the corresponding functionality is provided. The third layer 123 is a ground plane, and the fourth layer 124 is the secondary signal side 102b whereon the pattern of solder contacts 106 are configured to match the I/O pins of the original 68-pin PLCC or other surface mount device. The first and second patterns of contact pads 104 and 106 are interconnected via the signal layer 122 of the printed wiring board 102 using conventional printed wiring board technology.

While the preferred embodiment of the invention has been illustrated and described, it will be appreciated that various changes can be made therein without departing from the spirit and scope of the invention.

What is claimed is:

1. An adapter for a surface mount device, the adapter comprising:

an insulating body having offset first and second surfaces;
a plurality of surface mount solder pads formed on the first surface in a pattern structured for connection thereto of a replacement surface mount device;
a pattern of signal carriers communicating between the first and second surfaces, each of the signal carriers being at least partially exposed in a peripheral area extending between the first and second surfaces and in an area adjacent to the second surface;
a plurality of electrical contacts formed on the second surface and being electrically coupled to different ones of the signal carriers, the plurality of electrical contacts formed on the second surface being structured for connection to a corresponding contact area of a parent printed circuit board; and
a plurality of signal lines electrically coupling one or more of the surface mount solder pads on the first surface with predetermined ones of the signal carriers, fewer of the surface mount solder pads on the first surface of the insulating body being provided for connection thereto of a replacement surface mount device than the plurality of electrical contacts formed on the second surface of the insulating body for connection to a corresponding contact area of a parent printed circuit board for a replaced device.

2. The adapter of claim 1 wherein the insulated body further comprises a signal layer laminated between the first and second surfaces with one or more of the plurality of signal lines being formed on the signal layer.

3. The adapter of claim 1 wherein each of the signal carriers further comprises an electrically conductive material formed on an interior surface of a passage that communicates between the first and second surfaces.

4. The adapter of claim 1 wherein the signal lines couple a function of a replacement surface mount device to a signal carrier that corresponds to a position in the pattern of signal carriers that is associated with a similar function provided by a replaced surface mount device.

5. A surface mount adapter for a surface mount device, the adapter comprising:
a printed circuit board having a top layer and bottom layer;
a first footprint comprising a first quantity of input/output leads formed on the top layer of the printed circuit board for receiving a replacement surface mount device;
a second footprint comprising a second quantity of input/output leads formed on the bottom layer of the printed circuit board and arranged for simulating a surface mount device replaced by the replacement surface mount device, the second quantity of input/output leads being greater than the first quantity and being arranged for electrical connection to a parent printed circuit board in a position corresponding to the replaced surface mount device; and
a plurality of input/output lines connected between the first foot print and one or more of a plurality of electrical contacts corresponding to the second foot print, at least a portion of each of the input/output lines adjacent to the bottom layer being exposed between the top and bottom layers.

6. The adapter of claim 5, further comprising a plurality of solder pads formed on the top layer and corresponding to the first foot print.

7. The adapter of claim 6 wherein the input/output lines couple one or more of the solder pads on the top layer to one or more of the plurality of electrical contacts on the bottom layer.

8. The adapter of claim 6 wherein the electrical contacts further comprise a plurality of solder pads formed on the bottom layer and corresponding to the second foot print.

9. The adapter of claim 5 wherein each of the plurality of input/output lines further comprises a quantity of electrically conductive metal deposited in a groove that communicates between the top and bottom layers.

10. The adapter of claim 5, wherein the second foot print is different from the first foot print.

11. An adapter for a surface mounted device, the adapter comprising:
a printed circuit board having a top layer and a bottom layer;
a first pattern of solder pads formed on the top layer of the printed circuit board, the first pattern being structured with a first quantity of solder pads for receiving a first replacement surface mount device, the first replacement surface mount device having both input and output connections identical to a second surface mount device to be replaced by the replacement surface mount device with the input and output connections of the replacement surface mount device being fewer than the input and output connections of the second surface mount device to be replaced, and the first quantity of solder pads being of a number corresponding to the fewer input and output connections of the first replacement surface mount device;
a plurality of vias formed along a periphery of the printed circuit board and communicating between the top layer and the bottom layer, each of the vias having a quantity of electrically conductive material deposited therein;
an electrical signal line coupled between one of the solder pads and one of the vias; and
a second pattern of electrical contacts formed on the bottom layer of the printed circuit board, the second pattern being structured with a second quantity of solder pads being of a number corresponding to the number of input and output connections of the second surface mount device to be replaced by the replacement surface mount device and further being arranged to simulate the input and output connections of the second surface mount device.

12. The adapter of claim 11 wherein at least a portion of the electrically conductive material in each of the plurality of vias adjacent to the corresponding electrical contacts formed on the bottom layer is exposed between the top and bottom layers.

13. The adapter of claim 11 wherein each of the plurality of vias further comprises an electrically conductive material plated on an interior surface of a partial cylindrical passage.

14. The adapter of claim 11 wherein the printed circuit board further comprises a plurality of interconnected layers including a signal layer and a ground layer.

15. An adapter for a surface mounted device, the adapter comprising:
a body means for supporting a first surface mounted device relative to a printed circuit board;
a first quantity of interconnecting means corresponding to input and output connections of a first surface mounted device that is structured to replace a second surface mounted device, the first quantity of interconnecting means being positioned on a first surface of the body means for electrically interconnecting to the input and output connections of the first surface mounted device;
a second quantity of interconnecting means corresponding to input and output connections of a second surface mounted device to be replaced by the first surface mounted device, the second quantity of interconnecting means being positioned on a second surface of the body means for electrically interconnecting to a printed circuit board structured to receive the second surface mounted device, the second quantity of interconnecting means being greater than the first quantity of interconnecting means; and means for electrically coupling the first and second electrically interconnecting means, at least a portion of the electrically coupling means being exposed between the first and second surfaces of the body means.

16. The adapter of claim 15 wherein the electrically coupling means further comprises signal communication means spanning between the first and second surfaces along a peripheral surface of the body means.

17. The adapter of claim 15 wherein the exposed portion of the electrically coupling means is positioned adjacent to the second surface of the body means.

18. The adapter of claim 15 wherein the first interconnecting means further comprises means for forming an electrically conductive solder joint.

19. A method for adapting a first surface mounted device having a first quantity of input/output leads to replace a second surface mounted device having a second quantity of input/output leads that is different from the first quantity of input/output leads, the method comprising:

providing first electrical interconnecting means structured for coupling to a first quantity of input/output leads of a first surface mounted device;

providing second electrical interconnecting means structured for coupling to a printed circuit board structured to receive a second surface mounted device having a second quantity of input/output leads that is different from the first quantity of input/output leads, including providing the second electrical interconnecting means at a portion of an adapter body that remains available for visual inspection after assembly to a parent printed circuit board; and providing signal conduction means for carrying input/output signals between the first and second electrical interconnecting means.

20. The method of claim 19 wherein providing the second electrical interconnecting means at a portion of an adapter body that remains available for visual inspection after assembly to the parent printed circuit board further comprises providing at least a portion of the second electrical interconnecting means along an exterior surface of the adapter body.

21. The method of claim 19 wherein providing first electrical interconnecting means structured for coupling to input/output leads of a first surface mounted device further comprises forming a first quantity of solder pads on a top layer of the adapter body in a pattern structured to receive the input/output leads of the first surface mounted device.

22. The method of claim 21 further comprising soldering the input/output leads of the first surface mounted device to corresponding ones of the solder pads.

23. The method of claim 19 wherein providing second electrical interconnecting means structured for coupling to a printed circuit board structured to receive a second surface mounted device further comprises forming a quantity of contacts on a bottom layer of the adapter body in a pattern structured in a pattern simulating input/output leads of the second surface mounted device.

24. The method of claim 23, further comprising soldering the contacts on the bottom layer of the adapter body to solder pads on the parent printed circuit board corresponding to input/output leads of the second surface mounted device.

25. The method of claim 19 wherein providing signal conduction means for carrying input/output signals between the first and second electrical interconnecting means further comprises providing signal conduction means between one of the first electrical interconnecting means structured to couple to one input/output lead of the first surface mount device for providing a first input/output signal and one of the second electrical interconnecting means structured to couple to a contact on the parent printed circuit board that is structured to communicate with an input/output signal of the second surface mounted device similar to the first input/output signal of the first surface mount device.

26. The method of claim 19 wherein providing first electrical interconnecting means structured for coupling to a first quantity of input/output leads of a first surface mounted device further comprises providing a first quantity of contact areas for the first quantity of input/output leads of the first surface mounted device; and wherein providing second electrical interconnecting means structured for coupling to a printed circuit board structured to receive a second surface mounted device having a second quantity of input/output leads that is different from the first quantity of input/output leads further comprises providing a second quantity of contact areas for the second quantity of input/output leads that is greater than the first quantity of contact areas.

27. A parent printed circuit board assembly having a replacement surface mount device substituted for an original surface mounted device, the assembly comprising:

an adapter printed circuit board having a top layer and a bottom layer;

a footprint formed on the top layer of the adapter printed circuit board;

a replacement surface mount device being mounted to the footprint on the top layer of the adapter printed circuit board;

a plurality of signal carriers positioned along different peripheral edges of the adapter printed circuit board and extended between the top and bottom layers of the adapter printed circuit board and being at least partially exposed in an area adjacent to the bottom layer, each of the signal carriers being electrically and mechanically joined to a corresponding contact area of a parent printed circuit board; and a plurality of signal lines communicating between corresponding contact areas of the foot print and at least a portion of the signal carriers, fewer of the corresponding contact areas of the foot print on the top layer of the adapter printed circuit board being provided for the replacement surface mount device than the contact areas provided on the parent printed circuit board for a replaced device.

28. The adapter of claim 27, further comprising an electrical contact pad formed on the bottom layers of the printed circuit board at each of the signal carriers.

29. The adapter of claim 27, further comprising a solder joint whereby the signal carriers are electrically and mechanically joined to corresponding contact areas of the parent printed circuit board, each of the solder joint being at least partially formed on the partially exposed portion of each of the signal carriers.

30. The adapter of claim 27 wherein the replacement surface mount device is a replacement device structured to provide input/output signals substantially identical to input/output signals provided by the replaced device.

31. The adapter of claim 30 wherein input/output signals of the replacement device are coupled to contact areas of the parent printed circuit board structured to interface with corresponding input/output signals of the replaced device.

32. A parent printed circuit board assembly having a replacement surface mount device substituted for an original surface mounted device, the assembly comprising:

- an adapter printed circuit board having a top layer and a bottom layer;
- a footprint formed on the top layer of the adapter printed circuit board;
- a first surface mount device being mounted to the footprint on the top layer of the adapter printed circuit board, the first surface mount device being a replacement device structured to provide input/output signals substantially identical to input/output signals provided by a replaced device;
- a plurality of signal carriers positioned along different peripheral edges of the adapter printed circuit board and extended between the top and bottom layers of the adapter printed circuit board and being at least partially exposed in an area adjacent to the bottom layer, each of the signal carriers being electrically and mechanically joined to a corresponding contact area of a parent printed circuit board; and
- a plurality of signal lines communicating between corresponding contact areas of the foot print and at least a portion of the signal carriers, the signal lines being arranged such that input/output signals of the replacement device are coupled to contact areas of the parent printed circuit board structured to interface with corresponding input/output signals of the replaced device; and
- wherein fewer of the corresponding contact areas of the foot print are provided for the replacement device than the contact areas provided on the parent printed circuit board for the replaced device.

* * * * *